(12) United States Patent
Chen et al.

(10) Patent No.: US 10,755,630 B2
(45) Date of Patent: Aug. 25, 2020

(54) MOBILE TERMINAL

(71) Applicant: Beijing Xiaomi Mobile Software Co., Ltd., Beijing (CN)

(72) Inventors: Wei Chen, Beijing (CN); Lei Yu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/378,058

(22) Filed: Apr. 8, 2019

(65) Prior Publication Data

US 2019/0392752 A1 Dec. 26, 2019

(30) Foreign Application Priority Data

Jun. 22, 2018 (CN) .......................... 2018 1 0650270

(51) Int. Cl.
*G09G 3/3208* (2016.01)
*G02B 27/28* (2006.01)
(Continued)

(52) U.S. Cl.
CPC ......... *G09G 3/3208* (2013.01); *G02B 27/283* (2013.01); *H01L 25/167* (2013.01); *H01L 51/5281* (2013.01); *G09G 2360/144* (2013.01)

(58) Field of Classification Search
CPC ...... G01J 1/0429; G01J 1/4204; G02B 27/10; G02B 27/283; G09G 3/3208;
(Continued)

(56) References Cited

U.S. PATENT DOCUMENTS 8,130,378 B2  3/2012  Wu et al.
9,612,152 B2  4/2017  deJong et al.
(Continued)

FOREIGN PATENT DOCUMENTS

CN    204155595 U    2/2015
CN    105974697 A    9/2016
(Continued)

OTHER PUBLICATIONS

English version of International Search Report of PCT Application No. PCT/CN2018/107117, dated Mar. 6, 2019, issued by the ISA/CN—State Intellectual Property Office of the P.R. China.
(Continued)

*Primary Examiner* — Stacy Khoo
(74) *Attorney, Agent, or Firm* — Finnegan, Henderson, Farabow, Garrett & Dunner, L.L.P.

(57) ABSTRACT

The present disclosure relates to a mobile terminal, which is adopted to improve the accuracy of detecting ambient light. The mobile terminal includes a display panel, a first phase retarder, a light splitting element, and at least one light sensor. The first phase retarder is located between the display panel and the light splitting element; and the at least one light sensor is arranged opposite to the light splitting element, and to receive ambient light and light emitted by the display panel. The ambient light passing through the display panel and the light emitted by the display panel sequentially pass through the first phase retarder and the light splitting element. According to the technical solution of the present disclosure, the accuracy of detecting ambient light may be improved.

14 Claims, 3 Drawing Sheets

(51) Int. Cl.
*H01L 25/16* (2006.01)
*H01L 51/52* (2006.01)

(58) Field of Classification Search
CPC ............ G09G 2360/144; H01L 25/167; H01L 51/5281; H04M 1/026; H04M 1/0264; H04M 2250/12; H04N 5/2254; H04N 5/2257
See application file for complete search history.

(56) References Cited

U.S. PATENT DOCUMENTS

| | | | |
|---|---|---|---|
| 9,958,684 B1* | 5/2018 | Robbins | G02B 27/0018 |
| 2002/0109820 A1* | 8/2002 | Pan | G02B 27/283 |
| | | | 353/20 |
| 2010/0118293 A1 | 5/2010 | Wu et al. | |
| 2013/0176574 A1* | 7/2013 | Sirat | G02B 21/0076 |
| | | | 356/496 |
| 2014/0124647 A1* | 5/2014 | Hsu | G06F 1/3287 |
| | | | 250/206.1 |
| 2015/0122978 A1 | 5/2015 | deJong et al. | |
| 2017/0255017 A1* | 9/2017 | Haseltine | G02B 27/0172 |
| 2019/0243147 A1* | 8/2019 | Smithwick | G02B 5/3025 |
| 2019/0285883 A1* | 9/2019 | Cui | G02B 27/0172 |

FOREIGN PATENT DOCUMENTS

| | | | | |
|---|---|---|---|---|
| CN | 107241467 A | | 10/2017 | |
| CN | 107422484 A | * | 12/2017 | ........... G02B 27/283 |
| CN | 107909922 A | | 4/2018 | |
| JP | 2006067469 A | | 3/2006 | |
| TW | 201018888 A | | 5/2010 | |

OTHER PUBLICATIONS

English translation of Written Opinion of the International Searching Authority of PCT Application No. PCT/CN2018/107117, dated Mar. 6, 2019.

Extended Search Report for European Application No. 19178800.9 from the European Patent Office, dated Oct. 29, 2019.

* cited by examiner

MOBILE TERMINAL

CROSS-REFERENCE TO RELATED APPLICATIONS

This application is based upon and claims priority to Chinese Patent Application No. 201810650270.5, filed on Jun. 22, 2018, the contents of which are incorporated by reference in its entirety.

TECHNICAL FIELD

The present disclosure generally relates to the technical field of terminals, and more particularly to, a mobile terminal.

BACKGROUND

An ambient light sensor is usually arranged in a mobile terminal. The ambient light sensor is usually arranged below a glass cover plate of the mobile terminal and is arranged to detect an intensity of ambient light to regulate brightness of a display screen. However, along with development of mobile terminals towards a full-screen direction, space below the glass cover plates becomes smaller and smaller. If ambient light sensors are still placed below the glass cover plates, development of the mobile terminals towards the full-screen direction may be hindered.

In related art, for increasing a screen-to-body ratio of a mobile terminal, two light sensors are arranged below a display panel of the mobile terminal. One of the light sensors is arranged to detect an intensity of light emitted by the display panel, the other of the light sensors is arranged to detect an intensity of mixed light of the light emitted by the display panel and ambient light, and then an intensity of the ambient light is acquired according to detection results of the two light sensors. However, an ambient light detection result obtained by the solution is not so accurate. Therefore, how to improve the accuracy of detecting ambient light is a technical problem urgent to be solved.

SUMMARY

For solving the problem existing in the related art, embodiments of the present disclosure provide a mobile terminal, which is adopted to improve the accuracy of detecting ambient light.

According to a first aspect of the embodiments of the present disclosure, a mobile terminal is provided. The mobile terminal may include a display panel, a first phase retarder, a light splitting element, and at least one light sensor. The first phase retarder is located between the display panel and the light splitting element; and the at least one light sensor is arranged opposite to the light splitting element, and to receive ambient light and light emitted by the display panel. The ambient light passing through the display panel and the light emitted by the display panel sequentially pass through the first phase retarder and the light splitting element.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure.

Figure 1:
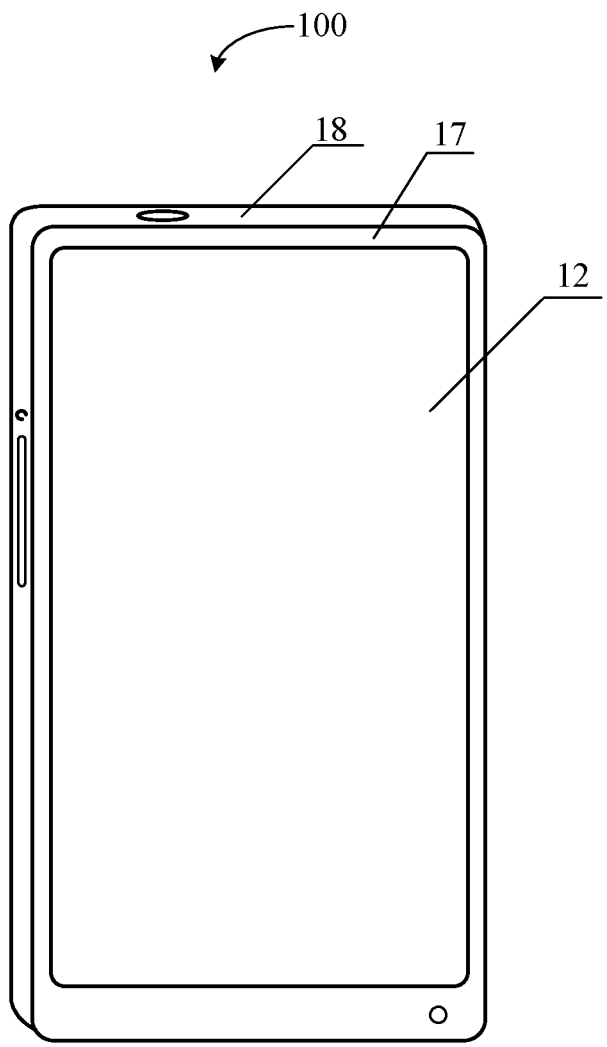
FIG. 1 is a schematic diagram of a mobile terminal, according to an exemplary embodiment.

FIG. 1 is a schematic diagram of a mobile terminal 100, according to an exemplary embodiment. The mobile terminal 100 includes a housing 18, a transparent glass cover plate 17 and a display panel 12 located below the glass cover plate 17. The display panel 12 is located in the housing 18. Light emitted by the display panel 12 may pass through the glass cover plate 17. The display panel 12 may be seen through the transparent glass cover plate 17. The display panel 12 may be, for example, an organic light-emitting diode (OLED) display panel.

Figure 2:
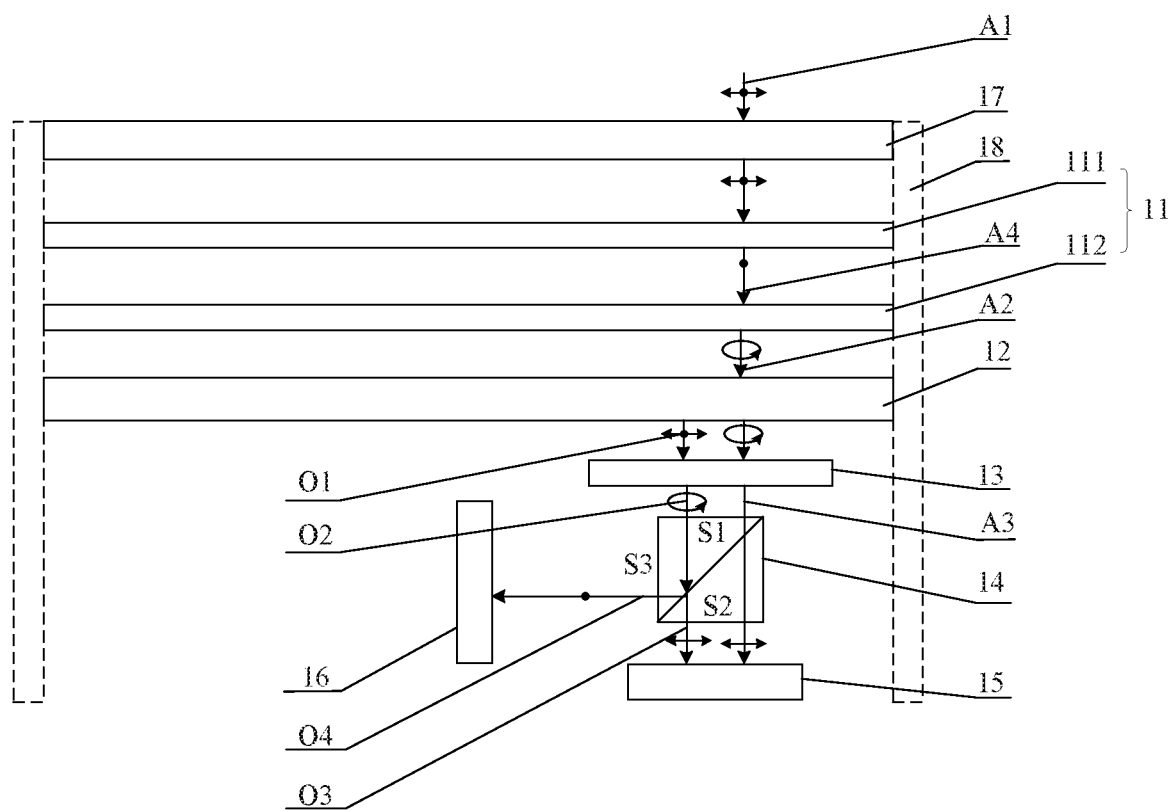
FIG. 2 is a schematic diagram illustrating a cross section of a mobile terminal, according to an exemplary embodiment.

FIG. 2 is a schematic diagram illustrating a cross section of the mobile terminal 100 (FIG. 1), according to an exemplary embodiment. As shown in FIG. 2, the mobile terminal 100 of the embodiment of the present disclosure further includes a first phase retarder 13, a light splitting element 14 and at least one light sensor 15 or 16.

As shown in FIG. 2, the first phase retarder 13 is located between the display panel 12 and the light splitting element 14. Each of the at least one light sensor 15 or 16 is arranged opposite to the light splitting element 14 and is arranged to receive ambient light and the light emitted by the display panel 12, and the ambient light passing through the display panel 12 and the light emitted by the display panel 12 sequentially pass through the first phase retarder 13 and the light splitting element 14.

In the embodiment, the first phase retarder 13 converts the light emitted by the display panel 12 into circularly polarized light. Then, the light emitted by the display panel 12 is split by the light splitting element 14 to obtain two beams of linearly polarized light in mutually perpendicular polarizing directions, propagation paths of the two beams of linearly polarized light being different. Then, the two beams of linearly polarized light may be detected respectively. The ambient light passing through the display panel 12 may sequentially pass through the first phase retarder 13 and the light splitting element 14, and the ambient light is received by the light sensor 15 or 16. The light splitting element 14 has a light splitting function for incident light at a specific incidence angle and may not realize the light splitting function for incident light at other incidence angles. Therefore, according to the technical solution provided by the embodiments of the present disclosure, the light emitted by the same display region on the display panel may be split and detected respectively to eliminate influence from a display content of the display screen and the accuracy of detecting ambient light may be improved.

As shown in FIG. 2, in an embodiment, the glass cover plate 17 is located on the side, far away from the first phase retarder 13, of the display panel 12.

As shown in FIG. 2, in an embodiment, the mobile terminal 100 may further include a circular polarizing plate 11. The circular polarizing plate 11 is located on the side, far away from the first phase retarder 13, of the display panel 12 and is arranged to convert ambient light A1 into first circularly polarized light A2. In an embodiment, the circular polarizing plate 11 is located between the glass cover plate 17 and the display panel 12.

As shown in FIG. 2, in an embodiment, the circular polarizing plate 11 may include a polarizer 111 and a second phase retarder 112. The polarizer 111 may be a polarizing plate and the second phase retarder 112 may be a quarter wave plate. The second phase retarder 112 is located between the polarizer 111 and the display panel 12 to convert the ambient light A1 into first circularly polarized light A2 after the ambient light sequentially passes through the polarizer 111 and the second phase retarder 112. For example, the ambient light A1 is converted into fourth linearly polarized light A4 after passing through the polarizer 111. A polarizing direction of the fourth linearly polarized light A4 may be perpendicular to an incidence plane for incidence of the ambient light A1 to the polarizer 111 and may also be parallel to the incidence plane for incidence of the ambient light A1 to the polarizer 111. As shown in FIG. 2, the polarizing direction of the fourth linearly polarized light A4 is perpendicular to the incidence plane for incidence of the ambient light A1 to the polarizer 111. In the embodiment of the present disclosure, descriptions are made with the condition that the polarizing direction of the fourth linearly polarized light A4 is perpendicular to the incidence plane for incidence of the ambient light A1 to the polarizer 111 as an example. The fourth linearly polarized light A4 is converted into the first circularly polarized light A2 after passing through the second phase retarder 112 and the first circularly polarized light A2 may pass through the display panel 12 for subsequent use for detection of an intensity of the ambient light A1.

In an embodiment, the first phase retarder 13 is arranged to convert the first circularly polarized light A2 passing through the display panel 12 into first linearly polarized light A3 and convert the light O1 emitted by the display panel 12 into second circularly polarized light O2.

In an embodiment, the first phase retarder 13 may be a quarter wave plate. The light O1 emitted by the display panel 12 may be unpolarized natural light. The light O1 emitted by the display panel 12 may be converted into the second circularly polarized light O2 after passing through the first phase retarder 13. The second circularly polarized light O2 may include left-handed circularly polarized light and right-handed circularly polarized light. The first circularly polarized light A2 may be converted into the first linearly polarized light A3 after passing through the first phase retarder 13. A polarizing direction of the first linearly polarized light A3 is mutually perpendicular to the polarizing direction of the fourth linearly polarized light A4. When the polarizing direction of the fourth linearly polarized light A4 is perpendicular to the incidence plane for incidence of the ambient light A1 to the polarizer 111, the polarizing direction of the first linearly polarized light A3 is parallel to an incidence plane for incidence of the first circularly polarized light A2 to the first phase retarder 13. When the polarizing direction of the fourth linearly polarized light A4 is parallel to the incidence plane for incidence of the ambient light A1 to the polarizer 111, the polarizing direction of the first linearly polarized light A3 is perpendicular to the incidence plane for incidence of the first circularly polarized light A2 to the first phase retarder 13. In the embodiment of the present disclosure, descriptions are made with the condition that the polarizing direction of the first linearly polarized light A3 is parallel to the incidence plane for incidence of the first circularly polarized light A2 to the first phase retarder 13, as shown in FIG. 2, as an example.

In an embodiment, the light splitting element 14 is arranged to transmit the first linearly polarized light A3 and split the second circularly polarized light O2 to obtain second linearly polarized light O3 and third linearly polarized light O4. Propagation directions of the second linearly polarized light O3 and the first linearly polarized light A3 are the same and propagation directions of the third linearly polarized light O4 and the second linearly polarized light O3 are different. Each of the at least one light sensor 15 or 16 is arranged to detect a first intensity of mixed light of the first linearly polarized light A3 and the second linearly polarized light O3 and detect a second intensity of the third linearly polarized light O4, to acquire the intensity of the ambient light A1 according to the first intensity and the second intensity. Since there is an association relationship between the second intensity of the third linearly polarized light and an intensity of the second linearly polarized light, the intensity of the second linearly polarized light may be obtained according to the second intensity and an intensity of the first linearly polarized light may further be obtained according to the first intensity and the intensity of the second linearly polarized light. Then, the intensity of the ambient light may be obtained according to an association relationship between the intensity of the first linearly polarized light and the intensity of the ambient light. According to the technical solution provided by the embodiment of the present disclosure, the light emitted by the same display region on the display panel may be split and detected respectively to eliminate the influence on the display content of the display panel and improve the accuracy of detecting ambient light. Moreover, the light sensor for detecting the ambient light is placed by use of a clearance space below the display panel, so that a screen-to-body ratio of the terminal device may be increased.

As shown in FIG. 2, in an embodiment, the light splitting element 14 may be a polarizing light splitting prism. The polarizing light splitting prism includes a first side surface S1, a second side surface S2 and a third side surface S3. The first side surface S1 is parallel to a side surface, opposite to the first side surface S1, on the first phase retarder 13 to make the first linearly polarized light A3 and the second circularly polarized light O2 perpendicularly incident to the polarizing light splitting prism. Incidence angles of the first linearly polarized light A3 and the second circularly polarized light O2 may be Brewster angles. The second side surface S2 is opposite and parallel to the first side surface S1, and the second side surface S2 is adjacent and perpendicular to the third side surface S3. The polarizing light splitting prism allows the first linearly polarized light A3 to be transmitted and splits the second circularly polarized light O2 into the second linearly polarized light O3 and the third linearly polarized light O4. In the embodiment, the polarizing direction of the first linearly polarized light A3 and a polarizing direction of the second linearly polarized light O3 are parallel to an incidence plane for incidence to the polarizing light splitting prism respectively, and a polarizing direction of the third linearly polarized light O4 is perpendicular to the incidence plane. The first linearly polarized light A3 and the second linearly polarized light O3 are emergent from the second side surface S2, and the third linearly polarized light O4 is emergent front the third side surface S3. It is to be noted that, in the embodiment of the present disclosure, all the incidence planes may be parallel to one another.

In an embodiment, the at least one light sensor 15 or 16 includes a first light sensor 15 and a second light sensor 16. The first light sensor 15 is located on the propagation path of the first linearly polarized light A3 and the second linearly polarized light O3 and is arranged to detect the first intensity of the mixed light of the first linearly polarized light A3 and the second linearly polarized light O3. The second light sensor 16 is located on the propagation path of the third linearly polarized light O4 and is arranged to detect the second intensity of the third linearly polarized light O4.

As shown in FIG. 2, in an embodiment, when the polarizing direction of the first linearly polarized light A3 is parallel to an incidence plane for incidence of the first linearly polarized light A3 to the light splitting element 14, the first linearly polarized light A3 and the second linearly polarized light O3 are emergent from the second side surface S2 and the third linearly polarized light O4 is emergent from the third side surface S3, the first light sensor 15 is arranged opposite to the second side surface S2 and the second light sensor 16 is arranged opposite to the third side surface S3.

In another embodiment, the polarizing direction of the first linearly polarized light A3 and the polarizing direction of the second linearly polarized light O3 are perpendicular to the incidence plane for incidence to the polarizing light splitting prism, and the polarizing direction of the third linearly polarized light O4 is parallel to the incidence plane. In the embodiment, the first linearly polarized light A3 and the second linearly polarized light O3 are emergent from the third side surface S3, and the third linearly polarized light O4 is emergent from the second side surface S2. The first light sensor 15 is arranged opposite to the third side surface S3 and the second light sensor 16 is arranged opposite to the second side surface S2.

It is to be noted that the left-handed circularly polarized light may be split into the second linearly polarized light O3 and the third linearly polarized light O4 after passing through the light splitting element 14, and the right-handed circularly polarized light may also be split into the second linearly polarized light O3 and the third linearly polarized light O4 after passing through the light splitting element 14.

Figure 3:
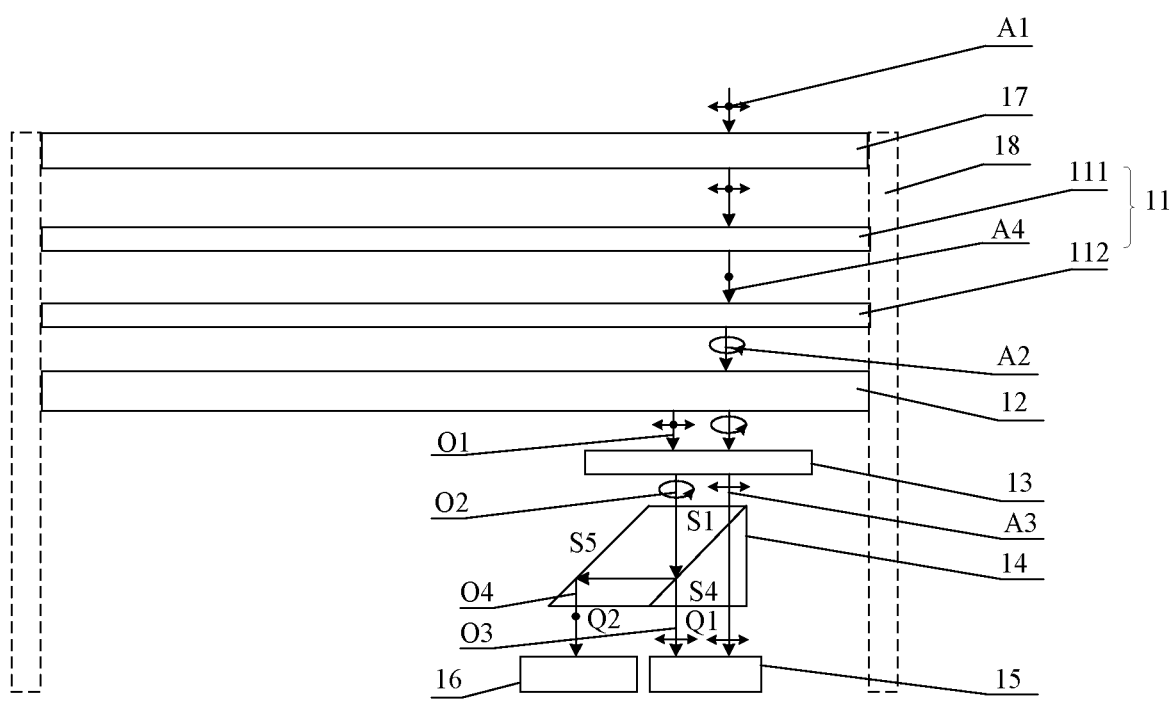
FIG. 3 is a schematic diagram illustrating a cross section of a mobile terminal, according to another exemplary embodiment.

As shown in FIG. 3, in another embodiment, the light splitting element 14 may be a lateral displacement polarizing light splitting prism. The lateral displacement polarizing light splitting prism includes the first side surface S1, a fourth side surface S4 and a fifth side surface S5. The first side surface S1 is parallel to the side surface, opposite to the first side surface S1, on the first phase retarder 13 to make the first linearly polarized light A3 and the second circularly polarized light O2 perpendicularly incident to the polarizing light splitting prism. The incidence angles of the first linearly polarized light A3 and the second circularly polarized light O2 may be Brewster angles. The fourth side surface S4 is opposite and parallel to the first side surface S1, the fourth side surface S4 is adjacent to the fifth side surface S5, and an angle between the fourth side surface S4 and the fifth side surface S5 is an acute angle. The angle may be set according to a specific condition. The fourth side surface S4 includes a first region Q1 and a second region Q2, the first region Q1 is opposite to the first side surface S1 and the second region Q2 is located on the side of the fifth side surface S5. In the embodiment, the polarizing direction of the first linearly polarized light A3 and the polarizing direction of the second linearly polarized light O3 are parallel to the incidence plane for incidence to the polarizing light splitting prism, and the polarizing direction of the third linearly polarized light O4 is perpendicular to the incidence plane. The first linearly polarized light A3 and the second linearly polarized light O3 are emergent from the first region Q1 and an emergence direction may be perpendicular to the fourth side surface S4. The third linearly polarized light O4 is emergent from the second region Q2 after being reflected by the fifth side surface S5, and an emergence direction may also be perpendicular to the fourth side surface S4. In the embodiment, the first light sensor 15 is arranged opposite to the first region Q1 and the second light sensor 16 is arranged opposite to the second region Q2.

In another embodiment, the polarizing direction of the first linearly polarized light A3 and the polarizing direction of the second linearly polarized light O3 are perpendicular to the incidence plane for incidence to the polarizing light splitting prism, and the polarizing direction of the third linearly polarized light O4 is parallel to the incidence plane. In the embodiment, the first linearly polarized light A3 and the second linearly polarized light O3 are emergent from the second region Q2 after being reflected by the fifth side surface S5, and the third linearly polarized light O4 is emergent from the first region Q1. The first light sensor 15 is opposite to the second region Q2 and the second light sensor 16 is opposite to the first region Q1.

In the embodiments shown in FIG. 2 and FIG. 3, the polarizing light splitting prism or the lateral displacement polarizing light splitting prim may be adopted to split the second circularly polarized light O2 to obtain the second linearly polarized light O3 and third linearly polarized light O4 of which the polarizing directions are mutually perpendicular. A propagation direction of the first linearly polarized light A3 obtained from the natural light A1 changes in the polarizing light splitting prism or the lateral displacement polarizing light splitting prim when the polarizing direction of the first linearly polarized light A3 changes. In conclusion, the polarizing direction of the first linearly polarized light A3 and the polarizing direction of the second linearly polarized light O3 are same and are both the first polarizing direction. The polarizing direction of the third linearly polarized light O4 is a second polarizing direction. The first polarizing direction is perpendicular to the second polarizing direction.

In the embodiments shown in FIG. 2 and FIG. 3, substantially only the light perpendicularly incident front the first side surface S1 of the light splitting element 14 may be detected by the light sensors 15 and 16. Therefore, the light splitting element 14 may also have a function of limiting the range of an incident light, so the light emitted by the same display region on the display panel 12 may be split by the light splitting element 14 and be respectively detected. In such a manner, influence of stray light from multiple display regions on the display panel 12 may be avoided, further, the influence from the display content of the display panel may be eliminated and the accuracy of detecting ambient light may be improved.

During a practical application, the light splitting element 14 may not be limited to the abovementioned polarizing light splitting prism and lateral displacement polarizing light splitting prism. Another light splitting element, for example, a polarizing light splitting flat plate, may also be used. When the polarizing light splitting flat plate is adopted for splitting the second circularly polarized light O2, the polarizing light splitting flat plate may be inclined relative to the side surface, opposite to the polarizing light splitting flat plate, on the first phase retarder 13 to make the first linearly polarized light A3 and the second circularly polarized light O2 obliquely incident to the polarizing light splitting flat plate and further realize a function of the polarizing light splitting flat plate of splitting the second circularly polarized light O2.

In another embodiment, the mobile terminal may also detect the mixed light of the first linearly polarized light A3 and the second linearly polarized light O3, and the third linearly polarized light O4 through two different channels of a light sensor, respectively. The manner provided by the embodiments of the present disclosure is not intended to form any limit.

In an embodiment, the mobile terminal may further include an ambient detection circuit. The ambient light detection circuit is electrically connected with the at least one light sensor 15 or 16 to acquire the intensity of the ambient light according to the ambient light and the light emitted by the display panel, which are received by the at least one light sensor 15 or 16. In an embodiment, the ambient light detection circuit may obtain a third intensity of the second linearly polarized light according to the second intensity and the association relationship between the second intensity and the third intensity, and acquire the intensity of the ambient light according to a difference value between the first intensity and the third intensity. For example, the association relationship exists between the second intensity of the third linearly polarized light O4 and the intensity of the second linearly polarized light O3. The association relationship may be measured by an experiment and may also be theoretically calculated. The association relationship may be represented in a functional form. Therefore, the intensity of the second linearly polarized light O3 may be obtained according to the second intensity, and the intensity of the first linearly polarized light A3 may further be obtained according to the difference value between the first intensity and the intensity of the second linearly polarized light O3. Then, the intensity of the ambient light A1 may be obtained according to an association relationship between the intensity of the first linearly polarized light A3 and the intensity of the ambient light A1. Similarly, the association relationship between the intensity of the first linearly polarized light A3 and the intensity of the ambient light A1 may be measured by an experiment or may also be theoretically calculated. The association relationship may be represented in the functional form. Therefore, the influence from the display content of the display panel may be eliminated and the accuracy of detecting ambient light may be improved.

In another embodiment, the mobile terminal may further include a system on a chip (SOC). The SOC is electrically connected with the at least one light sensor 15 or 16 to acquire the intensity of the ambient light according to the ambient light and the light emitted by the display panel, which are received by the at least one light sensor 15 and 16. In an embodiment, the SOC may obtain the third intensity of the second linearly polarized light according to the second intensity and the association relationship between the second intensity and the third intensity, and acquire the intensity of the ambient light according to the difference value between the first intensity and the third intensity. In the embodiment, a method by which the SOC acquirers the intensity of the ambient light is similar to the method by which the ambient light detection circuit acquires the intensity of the ambient light and will not be repeated herein. In other words, in the embodiment, the original SOC of the mobile terminal may be adopted to realize a function of acquiring the intensity of the ambient light according to the first intensity and the second intensity by use of software. Additional hardware may be avoided and cost is reduced.

In addition, the circular polarizing plate 11 arranged above the display panel 12 may also eliminate reflected light generated by incidence of the first circularly polarized light A2 to the display panel 12, thereby avoiding influence of the reflected light on a display effect of the display panel 12. For example, the first circularly polarized light A2 is right-handed circularly polarized light. When the reflected light generated by incidence of the first circularly polarized light A2 to the display panel 12 is left-handed circularly polarized light, fifth linearly polarized light is generated after incidence of the left-handed circularly polarized light to the second phase retarder 112, a polarizing direction of the fifth linearly polarized light being parallel to an incidence plane for incidence of the left-handed circularly polarized light to the second phase retarder 112. Since the incidence plane for incidence of the left-handed circularly polarized light to the second phase retarder 112 is parallel to incidence plane for incidence of the ambient light A1 to the polarizer 111, the polarizing direction of the fifth linearly polarized light is perpendicular to the polarizing direction of the fourth linearly polarized light A4, that is, the polarizing direction of the fifth linearly polarized light is perpendicular to a polarization direction of the polarizer 111. When the fifth linearly polarized light is incident to the polarizer 111, the polarizer 111 may not allow the fifth linearly polarized light to pass through. Therefore, the reflected light generated by incidence of the first circularly polarized light A2 to the display panel 12 is eliminated.

In an embodiment, the display panel 12 may be, but not limited to, an OLED display panel. In an embodiment, the glass cover plate 17, the circular polarizing plate 11 and the display panel 12 may be integrated.

It is to be noted that, in the embodiments of the present disclosure, "below" refers to a direction that the glass cover plate 17 of the mobile terminal points to the display panel 12. Specific implementation of parts in the mobile terminal 100, for example, the housing 18, other than the display panel 12, the first phase retarder 13, the light splitting element 14 and the at least one light sensor 15 or 16 are not limited in the embodiments of the present disclosure.

The technical solution provided by the embodiments of the present disclosure may have the following beneficial effects. A first phase retarder converts light emitted by a display panel into circularly polarized light. Then, the light emitted by the display panel is split by a light splitting element to obtain two beams of linearly polarized light in mutually perpendicular polarizing directions, propagation paths of the two beams of linearly polarized light being different. Then, the two beams of linearly polarized light may be detected respectively. Ambient light passing through the display panel may sequentially pass through the first phase retarder and the light splitting element, then is received by the light sensor. The light splitting element has a light splitting function for incident light at a specific incidence angle and may not realize the light splitting function for incident light at other incidence angles. Therefore, according to the technical solution provided by the embodiments of the present disclosure, the light emitted by the same display region on the display panel may be split and detected to eliminate influence from a display content of the display screen and the accuracy of detecting ambient light may be improved.

Other implementation solutions of the present disclosure will be apparent to those skilled in the art from consideration of the specification and practice of the present disclosure. The present disclosure is intended to cover any variations, uses, or adaptations of the present disclosure following the general principles thereof and including such departures from the present disclosure as come within known or customary practice in the art. It is intended that the embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A mobile terminal, comprising:
   a display panel;
   a first phase retarder;
   a light splitting element; and
   at least one light sensor, wherein:
   the first phase retarder is located below the display panel,
   the light splitting element is located below the first phase retarder, and is arranged to split light emitted by the display panel and passing through the first phase retarder into a first linearly polarized light directed to a first direction and a second linearly polarized light directed to a second direction, the second direction being perpendicular to the first direction, and
   the at least one light sensor is arranged opposite to the light splitting element, and comprises a first light sensor and a second light sensor, the first light sensor being arranged to receive the first linearly polarized light and an ambient light passing through the display panel, and the second light sensor being arranged to receive the second linearly polarized light.

2. The mobile terminal of claim 1, wherein the light splitting element comprises a first side surface that is parallel to a side surface, opposite to the first surface, of the first phase retarder to make the ambient light and the light emitted by the display panel perpendicularly incident to the light splitting element.

3. The mobile terminal of claim 2, wherein the light splitting element is a polarizing light splitting prism.

4. The mobile terminal of claim 3, wherein:
   the polarizing light splitting prism comprises a second side surface and a third side surface;
   the second side surface is opposite and parallel to the first side surface;
   the second side surface is adjacent and perpendicular to the third side surface; and
   one of the first and second light sensors is arranged opposite to the second side surface and the other of the first and second light sensors is arranged opposite to the third side surface.

5. The mobile terminal of claim 2, wherein the light splitting element is a lateral displacement polarizing light splitting prism.

6. The mobile terminal of claim 5, wherein:
   the lateral displacement polarizing light splitting prism comprises a second side surface and a third side surface;
   the second side surface is opposite and parallel to the first side surface;
   the second side surface is adjacent to the third side surface, and an angle between the second side surface and the third side surface is an acute angle;
   the second side surface comprises a first region and a second region;
   the first region is opposite to the first side surface, and the second region is located on a side of the third side surface; and
   one of the first and second light sensors is opposite to the first region and the other of the first and second light sensors is opposite to the second region.

7. The mobile terminal of claim 1, wherein the light splitting element is a polarizing light splitting flat plate; and
   the polarizing light splitting flat plate is inclined relative to a side surface, opposite to the polarizing light splitting flat plate, on the first phase retarder to make the ambient light and the light emitted by the display panel obliquely incident to the polarizing light splitting flat plate.

8. The mobile terminal of claim 1, wherein the first phase retarder is a quarter wave plate.

9. The mobile terminal of claim 1, further comprising a circular polarizing plate, wherein the circular polarizing plate is located on a side of the display panel far away from the first phase retarder, and is arranged to convert the ambient light into circularly polarized light.

10. The mobile terminal of claim 9, wherein the circular polarizing plate comprises a polarizer and a second phase retarder; and the second phase retarder is located between the polarizer and the display panel.

11. The mobile terminal of claim 10, wherein the polarizer is a polarizing plate, and the second phase retarder is a quarter wave plate.

12. The mobile terminal of claim 1, further comprising an ambient light detection circuit, wherein the ambient light detection circuit is electrically connected with the at least one light sensor to acquire an intensity of the ambient light according to the ambient light and light emitted by the display panel, the ambient light and the emitted light being received by the at least one light sensor.

13. The mobile terminal of claim 1, further comprising a system on chip (SOC), wherein the SOC is electrically connected with the at least one light sensor to acquire the intensity of the ambient light according to the ambient light and light emitted by the display panel, the ambient light and the emitted light being received by the at least one light sensor.

14. The mobile terminal of claim 1, further comprising:
    a transparent glass cover plate,
    wherein the transparent glass cover plate is located above the display panel and is arranged to allow the light emitted by the display panel to pass through.

* * * * *